United States Patent [19]

Davidson et al.

[11] 4,136,290

[45] Jan. 23, 1979

[54] JOSEPHSON SELF GATING AND CIRCUIT AND LATCH CIRCUIT

[75] Inventors: Arthur Davidson, Yorktown Heights; Dennis J. Herrell, Somers, both of N.Y.

[73] Assignee: International Business Machines Corporation, Armonk, N.Y.

[21] Appl. No.: 855,858

[22] Filed: Nov. 30, 1977

[51] Int. Cl.$^2$ .................... H03K 3/38; H03K 19/195
[52] U.S. Cl. ................................. 307/277; 307/212; 307/306
[58] Field of Search ............... 307/212, 245, 277, 291, 307/306

[56] References Cited

U.S. PATENT DOCUMENTS 3,953,749   4/1976   Baechtold et al. .................... 307/277

*Primary Examiner*—John Zazworsky
*Attorney, Agent, or Firm*—Thomas J. Kilgannon, Jr.

[57] ABSTRACT

A Josephson Self Gating And circuit which is powered by pulsed or clipped alternating current and provides true and complement outputs in response to true and complement inputs is disclosed. Inputs applied during the duration of the applied pulsed power or clipped alternating current are delivered to outputs which are maintained in that state in spite of a change of input within the given pulse duration. In one embodiment, the presence of an output signal interrupts a current path which, in turn, disables a pair of AND gates. These gates, even though the input to them changes, can provide no other output until the applied power falls to zero resetting the pair of AND gates which are latching in character. In another embodiment, current paths of one AND gate are cross-coupled with a current path of another AND gate. The interruption of current in a serially disposed Josephson device in one or the other of the current paths disables one or the other of the pair of AND gates preventing a change in outputs until the next cycle of applied pulsed or alternating current power. A latch circuit incorporating a pair of AND gates, a flip-flop and a Self Gating And circuit is also disclosed. The latch permits an input different from a previously applied input to the flip-flop to change the state of the flip-flop without changing the output of the Self Gating And during the application of a cycle of pulsed or alternating current power. The changed input to the flip-flop appears at the output of the Self Gating And circuit during the next cycle of applied pulsed or alternating current power.

32 Claims, 3 Drawing Figures a master flip-flop. In these arrangements, a first clock pulse transfers information from the master flip-flop to a slave flip-flop via a pair of AND gates setting the state of the slave which then applies outputs to a logic circuit, for example. After the first clock disappears, a second clock pulse activates another pair of AND gates thereby applying inputs from a previous logic stage to the master flip-flop. When the second clock disappears, the first clock goes on again. In this way, information is prevented from passing through the flip-flops in an uncontrolled or race condition. While the flip-flop and the input AND gates of the present latch are configured with Josephson devices, they have counterparts in other technologies and in and of themselves are not novel. The present latch, relative to known prior art latches, eliminates the slave flip-flop and the first and second clocks which are required to control the master and slave AND gate inputs. Finally, in addition to being clocked by the applied pulsed or alternating current power, the present latch cannot provide a spurious output during the interval when the pulsed power is applied because the Self Gating And is locked in that state until the next cycle of applied pulse power. In the meantime, however, the flip-flop can be updated by a changing input during the same pulsed power cycle.

JOSEPHSON SELF GATING AND CIRCUIT AND LATCH CIRCUIT

BACKGROUND OF THE INVENTION

1. Field of the Invention

This invention relates generally to Josephson latching circuits which are powered by unipolar current pulses or by clipped alternating current. More specifically, it relates to a Josephson junction latching circuit which is capable of providing true and complement outputs in response to true and complement inputs. Still more specifically, it relates to a Josephson junction latching circuit which is pulsed powered; the outputs of which cannot be changed for the duration of the applied pulsed power despite a change in the inputs within the duration of the applied pulse power. Still more specifically, it applies to a Josephson latching circuit which includes a pair of Josephson AND gates one of which provides an output and the other of which is disabled from providing an output should the inputs to the AND gates change during the same cycle of applied pulsed or alternating current power. Still more specifically, it relates to a latch circuit which incorporates a Self Gating And circuit, a flip-flop and input circuits which determine the state of the flip-flop. The Self Gating And circuit, in addition to providing unchanging true and complementary outputs during application of a pulse of given pulse duration, also provides these outputs to control circuits which apply inputs to a flip-flop which, in turn, controls the outputs of the Self Gating And circuit. The control circuits, in the form of a pair of AND gates, permit the flip-flop which triggers the Self Gating And circuit to be updated with a new input during the application of a single cycle of pulsed power without affecting the output of the Self Gating And circuit. The circuits of the present application have as a principal advantage the fact that independent clock pulses are eliminated because setting and resetting is accomplished by the applied pulsed or alternating current power. This feature eliminates possible clocking skew normally associated with independently clocked circuits. In addition, the possibility for race conditions is entirely eliminated.

2. Description of the Prior Art

With respect to the Self Gating And circuit of the present application, there is no known counterpart for the Self Gating And circuit in the prior art. This circuit, while it locks itself in the last state applied to its inputs, is unlocked not by a change of signals on its input but by the resetting action of the applied pulsed or alternating current power.

With respect to the latch which incorporates the Self Gating And circuit, there are prior art latches which provide a similar result but are more complex than the latch of the present application.

Prior art latches use separate clocks; the outputs of which are non-overlapping to provide for the enablement of AND gates which are disposed before and after

SUMMARY OF THE INVENTION

In accordance with the broadest aspect of the present invention, a self gating circuit is disclosed which utilizes a latching circuit adapted to provide, via output interconnection lines, true and complement outputs in response to true and complement inputs. The latching circuit includes at least a single device capable of carrying Josephson current. It further includes a source of pulsed power of given pulse duration connected to the latching circuit and means for maintaining the outputs obtained in response to the true and complement inputs for the given pulse duration despite a change in the inputs within the given pulse duration.

In accordance with the broadest aspects of the present invention, a self gating circuit is disclosed wherein the latching circuit utilizes a pair of circuits each including at least a pair of actuable devices capable of carrying Josephson current connected in parallel. It also utilizes a terminating load connected in parallel with each of the pair of actuable devices via the output interconnection line; the load having a value of impedance sufficient to cause the pair of circuits to operate in a latching mode.

In accordance with the broader aspects of the present invention, a self gating circuit is provided wherein the means for maintaining the outputs for a given pulse duration includes a current path disposed in series with a first one of the pair of actuable devices of one and the other of the pair of circuits. The current path of one of the pair of circuits has a portion thereof disposed in electromagnetically coupled relationship with a second one of the pair of actuable devices of the other of the pair of circuits. Further, the current paths of the other of the pair of circuits has a portion thereof disposed in electromagnetically coupled relationship with a second one of the pair of actuable devices of the first one of the pair of circuits.

In accordance with the broader aspects of the present invention, a self gating circuit is provided wherein the means for maintaining the outputs for a given pulse duration includes a current path one portion of which is disposed in electromagnetically coupled relationship with one of the pair of actuable devices of one of the pair of circuits and another portion of which is disposed in electromagnetically coupled relationship with one of the pair of actuable devices of the other of the pair of circuits. At least one switchable device capable of carrying Josephson current is disposed in the current path and in electromagnetically coupled relationship with each of the output interconnection lines. A terminating impedance is disposed in parallel with the switchable device and the source of pulsed power of pulse duration equal to said given pulse duration is connected to the current path.

In accordance with the broader aspects of the present invention, a self gating circuit is provided which further includes a flip-flop having input and output terminals; the outputs of which are electrically connected to the latching circuit.

In accordance with the broader aspects of the present invention, a self gating circuit is disclosed which further utilizes means connected to the input terminals of the flip-flop for applying either a set or reset signal thereto and further utilizes means electrically coupled to the means for applying for gating to the flip-flop, during said given pulse duration, at least that one of the set and reset signals which is different from that initially applied to the flip-flop.

In accordance with the broader aspects of the present invention, a self gating circuit is disclosed which utilizes means connected to the input terminals of the flip-flop for applying either a set or reset signal and, further utilizes means electrically coupled to the means for applying for gating to the flip-flop, during the given pulse duration, only that one of the set and reset signals which is different from that initially applied to the flip-flop.

In accordance with the more particular aspects of the present invention, a self gating circuit is disclosed wherein the means for applying either a set or reset signal includes a pair of AND gates each of which includes an input terminal, first and second devices capable of carrying Josephson current connected in parallel, an output load and an interconnection line a portion of which is disposed in electromagnetically coupled relationship with the input terminal of the flip-flop.

In accordance with still more particular aspects of the present invention, a self gating circuit is disclosed wherein the means for gating to the flip-flop at least that one of the set and reset signals which is different utilizes a portion of the output interconnection lines disposed in electromagnetically coupled relationship with the second device of the pair of AND gates to enable at least that one of the pair of AND gates to which a signal in form of zero current was initially applied during the given pulse duration.

In accordance with still more particular aspects of the present invention, a latch circuit is disclosed which includes a latching circuit adapted to provide, via outut interconnection lines, true and complement outputs in response to true and complement inputs which are applicable to the circuit during a given interval. The latching circuit includes at least a single device capable of carrying Josephson current. The circuit further utilizes a flip-flop having input and output terminals; the outputs of which are electrically coupled to the latching circuits and means connected to the input terminals of the flip-flop for applying either a set or resets signal thereto. Also utilized are means for maintaining the outputs obtained in response to the true and complement inputs for the given interval despite a change in the inputs within the given interval. Means electrically coupled to the means for applying for gating to the flip-flop, during the given interval, at least that one of the set and reset signals which is different from that initially applied to the flip-flop during the given interval are also utilized. Finally, a source of pulsed power of pulse duration equal to the given interval is connected to the latching circuit and the means for applying and a source of d.c. power is connected to the flip-flop.

It is, therefore, an object of this inventon to provide a Self Gating And circuit which provides an unchangeable output during the application of applied pulsed or alternating current power.

Another object is to provide a Self Gating And circuit which is latching in character and which is clocked by the applied pulsed power.

Still another object is to provide a latch which eliminates race conditions, independent clocks and slave flip-flops of the prior art.

Yet another object is to provide a latch wherein the output is maintained for the duration of the applied pulsed or alternating current power but still permits a flip-flop to be updated with a changing input.

The foregoing and other objects, features and advantages of the invention will become apparent from the following more particular description of the preferred embodiments of the invention as illustrated in the accompanying drawings.

DESCRIPTION OF A PREFERRED EMBODIMENT

Figure 1:
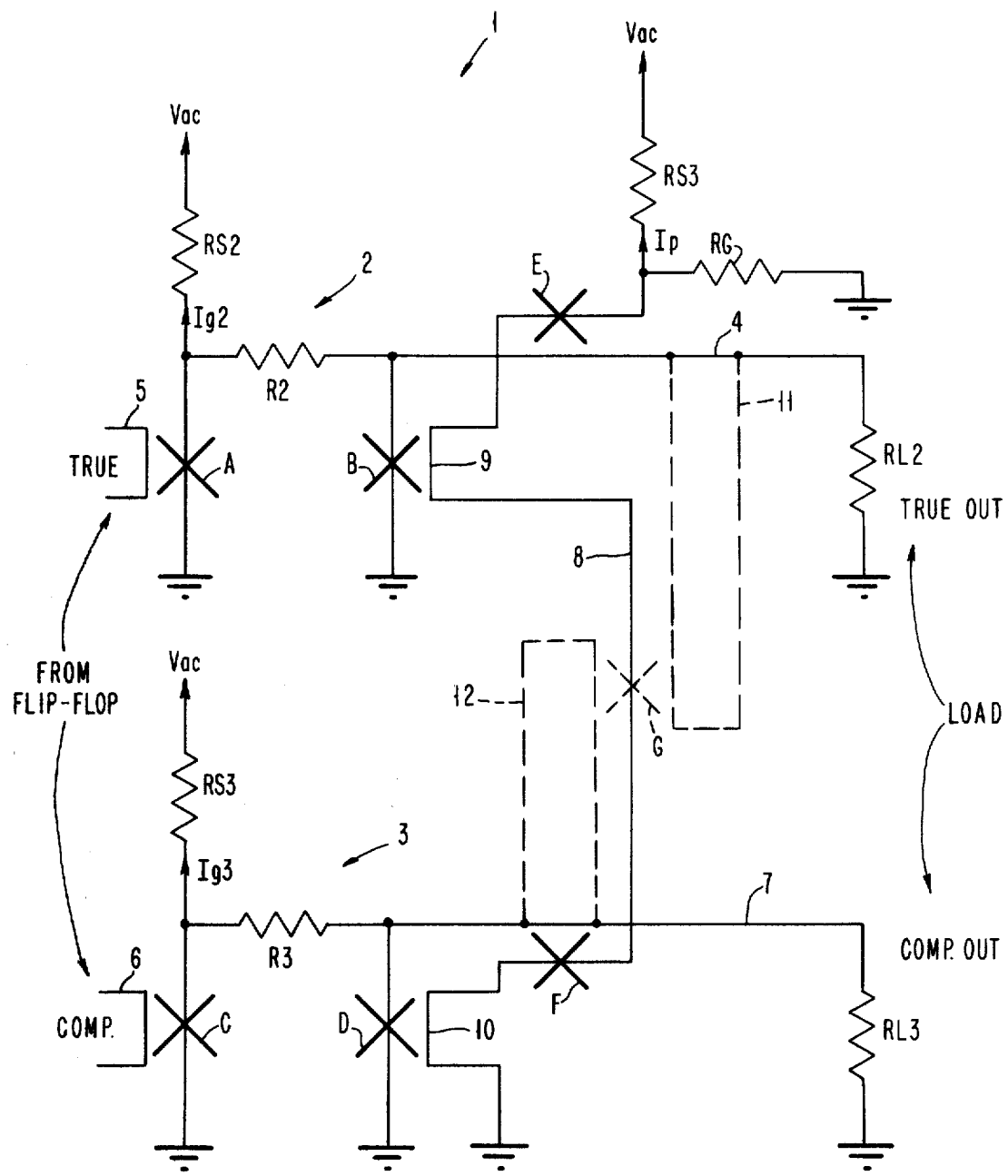
FIG. 1 is a schematic diagram of a Self Gating And (SGA) circuit. This circuit, after providing true and complement outputs in response to the application of true and complement inputs, prevents the outputs from changing if the inputs change at any time after the application of a current pulse of given pulsed duration.

Referring now to FIG. 1, there is shown therein a schematic diagram of a Self Gating And circuit hereinafter identified as SGA. The circuit of FIG. 1, after providing true and complement outputs in response to the application of true and complement inputs, prevents the outputs from changing if the inputs change at any time after the application of a current pulse of given pulse duration.

SGA circuit 1 of FIG. 1 includes a pair of AND gates identified in FIG. 1 by the reference numerals 2,3. AND gate 2 includes a pair of devices A,B, capable of carrying Josephson current connected in parallel. A resistance R2 is disposed between devices A,B while a load resistance RL2 is connected in parallel with device A,B via interconnection line 4. A voltage source identified in FIG. 1 as Vac is connected to device A via resistance RS2 which is of sufficient resistance to provide a substantially constant current Ig2 to the remainder of AND gate 2 in a well known manner. Resistance R2 has a resistance value which is sufficient to prevent current Ig2 from passing into device B when device A is in the zero voltage state. Resistance RL2 has a resistance value which is sufficient to latch devices A, B in their voltage state after an input is applied to AND gate 2.

Control line 5 is shown in FIG. 1 disposed in electromagnetically coupled relationship with device A and is utilized to apply a TRUE input signal to AND gate 2. An output signal designated TRUE OUT in FIG. 1, appears in load resistance RL2.

AND gate 3 of FIG. 1 is identical with AND gate 2 and resistors R3, RL3, RS3 perform the same function as resistors R2, RL2, RS3, respectively. Similarly, devices C,D are identical with devices A, B, respectively, of FIG. 1. Control line 6 of AND gate 3 is disposed in electromagnetically coupled relationship with device C and is utilized to apply the complement input signal (otherwise designatd COMP. in FIG. 1) of the TRUE signal applied to control line 5 of AND gate 2. interconnection line 7 in FIG. 1 delivers an output signal designated COMP. OUT in FIG. 1 to load resistance RL3. Constant current Ig3 is identical with constant current Ig2 in FIG. 1. In FIG. 1, current path 8 includes a pair of devices E, F, while are capable of carrying Josephson current. Devices E, F are disposed in series in current path 8 and in electromagnetically coupled relationship with interconnection lines 4,7 respectively. A voltage source, also identified as Vac in FIG. 1, is connected to current path 8 via resistance RS3. The latter has sufficiently high resistance to provide a substantially constant current, Ip, to current path 8. A load resistance RG is disposed in parallel with current path 8 and is of sufficient resistance to cause devices E, F, to latch in their voltage state when switched by the presence of current in transmission lines 4 or 7. Control line portions 9, 10, of current path 8 are shown in FIG. 1 disposed in electromagnetically coupled relationship with devices, B, D, respectively, of AND gates 2,3 respectively.

Devices A-F may be well known in line Josephson gates or alternatively may be well known multi-junction interferometers. The voltage source designated Vac in FIG. 1 may be voltages sources which produce either unipolar pulses of given pulse duration or clipped alternating voltage pulses which are bipolar in character. Thus, the current pulses applied to AND gates 2,3 and current path 8 are either unipolar or bipolar current pulses.

As indicated hereinabove, the purpose of SGA 1 is to provide true and complement outputs in response to true and complement inputs which are applied within the pulse duration of an applied pulse of current, Ig2 or Ig3. Once the outputs are provided SGA 1 maintains the outputs obtained in response to the applied inputs regardless of whether or not the inputs to AND gates 2,3 change within the pulse duration of the applied current pulse. This result is achieved in the following manner.

Assuming, for purposes of illustration, that unipolar current pulses are simulataneously applied to AND gates 2,3 and current path 8 by the actuation of voltage source Vac and that a signal representing a binary "1" is applied to control line 5 of AND gate 2, device A of AND gate 2 which has current Ig2 flowing therein switches to the voltage state in a well known manner. The switching of device A diverts current Ig2 into resistor R2 and then into device B enabling that device. Now, because current Ip is flowing in current path 8 and hence in control line portions 9, 10, device B encounters both gate and control current which lowers its threshold and device B switches to its voltage state in a well known manner. The switching of device B diverts current Ig2 into interconnection line 4 and load resistance RL2 where output TRUE OUT is provided.

However, the presence of current Ig2 in interconnection line 4 which, it should be recalled, is disposed in electromagnetically coupled relationship with device E causes device E to switch to its voltage state diverting current Ip into load resistance RG. Current Ip no longer flows in current path 8 and devices B, D no longer experience control current in control line portions 9, 10. As a result, devices B, D are effectively disabled should gate current flow therein spuriously within the pulse duration of the applied current pulse. Because AND gate 2 is latched, that is, current Ig2 continues to flow in RL2 even after the input signal, TRUE, has disappeared, the reappearance of another TRUE input within the given pulse duration of the applied current pulse, cannot affect the output TRUE OUT in RL2. However, the appearance of a signal on control line 6 of AND gate 3 within the given pulse duration can actuate device C diverting current Ig3 via R3 into device D. Device D, however, experiences only current Ig3 and cannot switch to its voltage state in view of the absence of current Ip in control line portion 10 which is necessary to cause device D to switch. Current Ig3 flows to ground via device D and no spurious output appears at RL3 for the duration of the applied current pulse. Of course, when the applied pulse of given pulse duration is removed from AND gates 2, 3 and current path 8, all devices A-F are reset to their zero voltage state preparatory to delivering a signal to load RL2, RL3, when a new current pulse is applied to AND gates 2, 3.

If a signal were initially applied to input control line 6 of AND gate 3, it would operate in exactly the same way as described above in connection with the application of an input to control line 5 of AND gate 2 except that device B of AND gate 2 would be unable to switch if a spurious input were applied to control line 5. In the usual case inputs TRUE and COMP may, as indicated in FIG. 1, be derived from a flip-flop, which may be a part of a latch which is shown in block diagram form in FIG. 2.

Figure 2:
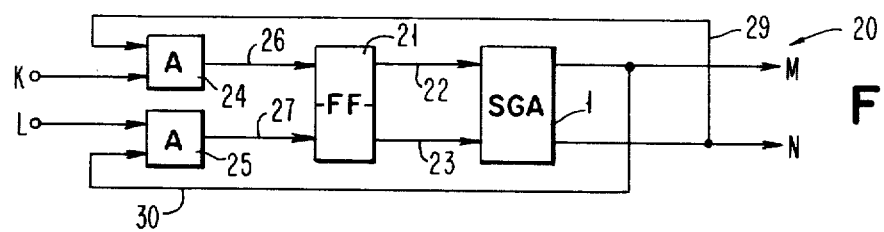
FIG. 2 is a block diagram of a latch circuit which incorporates an SGA circuit similar to that shown in FIG. 1. The SGA circuit in addition to providing unchanging true and complementary outputs during application of a pulse of given pulse duration, also provides these outputs to control circuits which, in turn, apply inputs to a flip-flop which controls the SGA.
Figure 3:
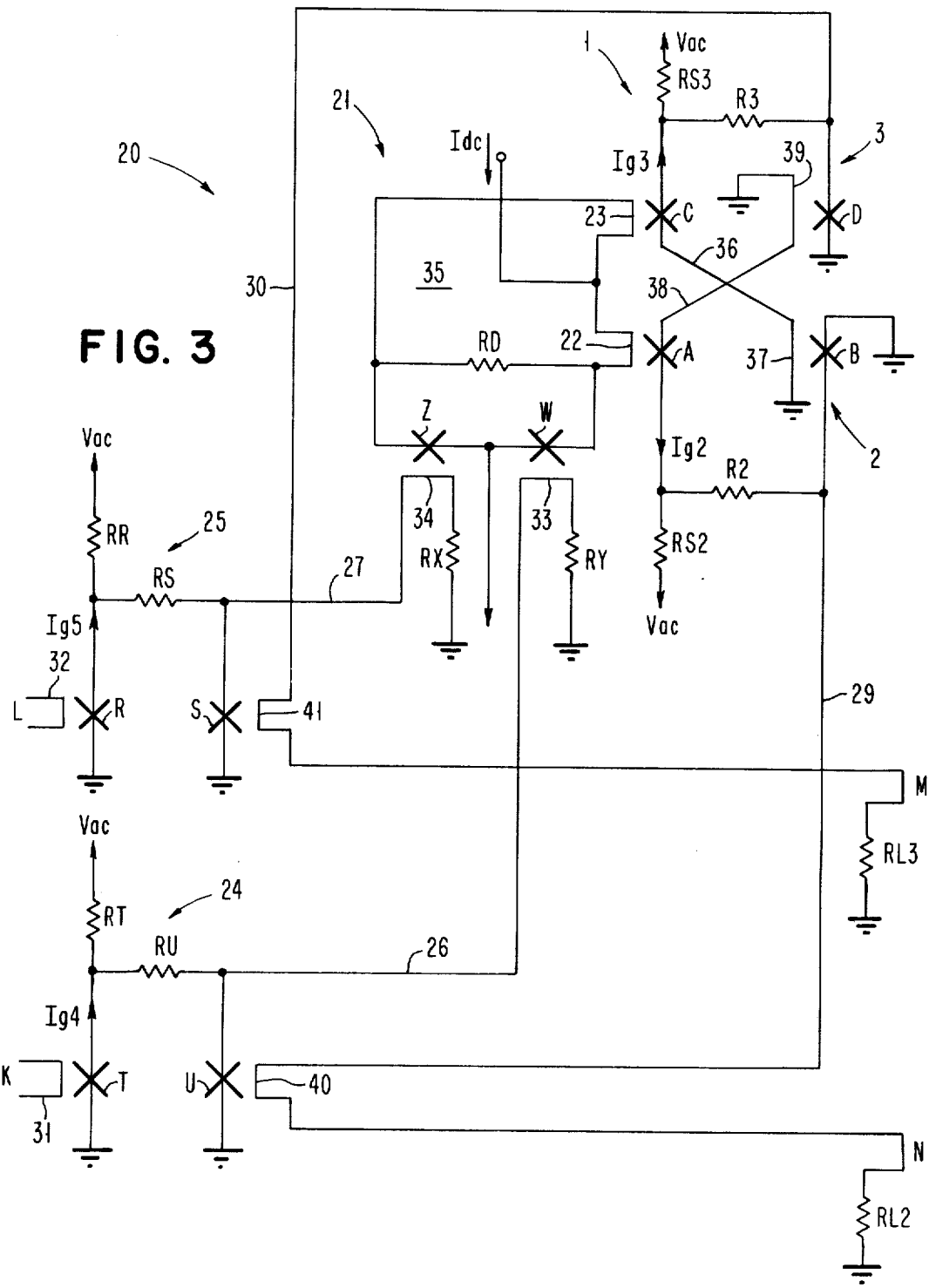
FIG. 3 is a schematic diagram which includes specific circuits for the input AND gates and the flip-flop shown in block diagram form in FIG. 2. Also, shown in a schematic of a Self Gating And circuit which is different from those shown in FIG. 1.

Before describing the latch of FIG. 2, it should be appreciated that the means for maintaining the state of AND gates 2,3 for the duration of an applied current pulse may be implemented in a number of ways. Another way is shown in FIG. 3 which will be discussed in connection with the description of that FIG. Another means for maintaining can be achieved using only one of devices E or F. By extending interconnection lines 4, 7 so that portions thereof are disposed in electromagnetically coupled relationship with either E or F, the latter, for example, will be actuated by current flow in either of lines 4, 7 diverting current Ip into load RG and achieving the disabling of either device B or D as appropriate.

In connection with voltage sources Vas of FIG. 1, Vac may be unipolar or bipolar without affecting the operation of SGA circuit 1. When the voltage is bipolar or clipped alternating pulses, AND gates 2, 3 act exactly as described above. Since Josephson devices are polarity blind, devices A-G reset to the zero voltage state each time the applied voltage passes through zero.

Referring now to FIG. 2, there is shown a block diagram of a latch circuit which incorporates an SGA circuit similar to that shown in FIG. 1. The SGA circuit, in addition to providing unchanging true and complementary outputs during application of a pulse of given pulse duration, also provides these outputs to control circuits which, in turn, apply inputs to a flip-flop which controls the SGA. These control circuits permit the flip-flop which triggers the SGA circuit to be updated with a new input during the application of a single cycle of pulse power without affecting the output of the SGA. In FIG. 2, only the flip-flop is d.c. powered while the remaining circuits are a.c. or pulsed powered.

Considering FIG. 2 in more detail, latch circuit 20 includes an SGA circuit 1 to which true and complement input signals are applied from flip-flop 21 (otherwise designated as FF in FIG. 2) via interconnections 22, 23, respectively. The inputs to flip-flop 21 are derived from a pair of AND gates 24,25, and are applied to flip-flop 21 via interconnections 26,27. Inputs K,L which may be derived from registers, storage media or previous logic stages comprise inputs to AND gates 24,25, respectively. The other input to AND gate 24 is output N of SGA circuit 1 which is applied to gate 24 via interconnection 29. Similarly, interconnection 30 delivers output M as the other input to AND gate 25.

In operation and assuming that a pulsed power cycle has been initiated and that the state of flip-flop 21 has been transferred to SGA circuit 1, it should be recalled that outputs M,N are maintained until the applied pulsed power is returned to zero. Thus, inputs M,N are applied during this time to AND gates 24,25. If, during this same pulsed power cycle, inputs K,L in true and complement form arrive, flip-flop 21 can be updated, if and only if the input is different from the input previously applied to flip-flop 21. This is accomplished by enabling the AND gate 24 or 25 which provided no output when signals K,L actuated flip-flop 21. Thus, if output M is present, this means that AND gate 24 was activated and an output was provided to SGA circuit 1 via interconnection 22. Since a similar input would provide the same output because flip-flop 21 does not change, there is no necessity for controlling this condition. The condition which must be permitted is that which arises when the input is different. This would mean that an output would be an N output derived initially from AND gate 25. If then, AND gate 25 is enabled, its output, when input signal L arrives, can update flip-flop 21 without disturbing output M,N during the same pulsed power cycle. AND gate 25 is enabled by feeding back output signal M via interconnection 30. Using the above described circuits, latch 20 can be updated without fear of providing spurious outputs during a given pulsed power cycle. The arrangement shown, while enabling one AND gate also inhibits the other AND gate, making certain that two like inputs can never appear on flip-flop 21. Where there is no fear of such a condition, outputs M,N can be fed to an OR gate and its output fed back to enable both AND gates 24,25 at the same time.

Referring now to FIG. 3, there is shown a schematic diagram of latch 20 which includes specific circuits for input AND gates 24,25, flip-flop 21 and SGA circuit 1. Elements in FIG. 3 which have the same function as those shown in FIGS. 1,2, have been given the same reference characters.

In FIG. 3, AND gate 24 consists of a pair of Josephson devices T,U, connected in parallel via a resistance RU, and a load impedance RY connected in parallel with these devices via interconnection 26. Impedance RY is a resistor having a value of resistance sufficient to make AND gate 24 latching in character. Input K is applied to control line 31 which is disposed in electromagnetically coupled relationship with Josephson device T. Current Ig4 is applied from voltage source Vac via high resistance resistor RT, applying a substantially constant current to AND gate 24 when source Vac is pulsed. AND gate 25 is identical with AND gate 24 and elements 27, 32, RR, RS, R, S and RX perform the same functions in AND gate 25 as do elements 26, 31, RT, RU, T, U, and RY, respectively. In addition, interconnection lines 26,27 have control line portions 33,34, respectively which are disposed in electromagnetically coupled relationship with Jpsephson devices W,Z of flip-flop 21.

In FIG. 3, flip-flop 21 includes Josephson devices W,Z connected in parallel in two branches of a loop 35, one branch of which includes control line portion or interconnection 22 while the other branch of which includes control line portion or interconnection 23. Damping resistor RD connected across devices Z,W damps any oscillations which might arise during the operation of the circuit. Loop 35 is disposed in series with a d.c. current source identified as Idc in FIG. 3.

Control line portions 22,23 of flip-flop 21 are disposed in electromagnetically coupled relationship with devices A,C of SGA circuit 1 of FIG. 3. SGA circuit 1 of FIG. 3 is slightly different from SGA circuit 1 of FIG. 1 in that currents flowing in devices A and C are used to enable or inhibit devices D and B, respectively, depending on which of the devices A or C is switched by current flow in control line portions 22,23 of flip-flop 21. Thus, device C has a series current path 36; a control line portion 37 of which is cross-coupled to and disposed in electromagnetically coupled relationship with device B. Similarly, device A has a series current path 38, a control line portion 39 of which is cross-coupled to and disposed in electromagnetically coupled relationship with device D. Using this circuit arrangement, when currents Ig2, Ig3, flow in devices A, C, respectively, both devices B and D are enabled. If either of devices A,C is switched, their cross-coupled devices D, B, respectively, are prevented from switching and their associated AND gates 3,2, respectively, are inhibited from responding to a change in input until all devices A–D are reset by the applied pulsed power going down. It should be noted, that outputs M,N pass to load resistances RL3,RL2, respectively via interconnection lines 30,29, respectively. Interconnection lines 29,30 have control line portions 40,41, respectively, disposed in electromagnetically coupled relationship with devices U,S, respectively, so that when current flows in portions 40 or 41, devices U or S, respectively, are enabled so that their associated AND gates 24,25, respectively, are enabled and can update flip-flop 21 without the output of SGA circuit 1 being affected.

The operation of the latch circuit of FIG. 3 can be understood by beginning the sequence of events by assuming the pulsed or a.c. power is at zero. Under such circumstances, there is no output current flow in either of devices M,N since all the pulsed or a.c. powered circuits including SGA 1 and AND gates 24,25 have been reset causing all their associated Josephson devices to be in their zero voltage state. In the meantime, flip-flop 21 has been set in one of two possible states as a result of an input on either control line portion 33 or control line portion 34. Assume, for purposes of explanation, that Josephson device W of flip-flop 21 had been switched to its voltage state in a previous cycle as a result of current flow in control line portion 33 associated with that device. In the new cycle, pulsed or a.c. power is applied and currents Ig2–Ig5 flow in their respective Josephson devices which are in the zero voltage state. However, current Idc flowing in control line portion 23 of loop 35 provides a control magnetic field on device C of SGA 1. Control magnetic field, in combination with current Ig3 switches device C to its voltage state diverting that current into device D via resistor R3. Current Ig3 is, therefore, removed from current paths 36 and control line portion 37 thereof, eliminating the presence of control magnetic field from device B of AND gate 2. At the same time, current Ig2 remains flowing in device A, current path 38 and control line portion 39 applying control magnetic field to device D of AND gate 3 permitting device D to switch and divert current Ig3 to load resistor RL3 via interconnection 30 and control line portion 41 thereof. The latter now applies a control magnetic field to its associated Josephson device S of AND gate 25. As a result of this sequence, device B of AND gate 2 is disabled from switching while device S of AND gate 25 is enabled. To the extent that true and complementary outputs are provided by latch 20, if output M is present in the form of current flow in load RL3, there is no output current flow in load RL2 and output N is zero. This means there is no current flow in interconnection 29 or in control line portion 40 thereof and, as a result, device U of AND gate 24 is disabled from switching. Device B of AND gate 2 is also disabled because it now experiences no control magnetic field in control line portion 37. Because the circuits to which pulsed or a.c. power is applied are latching in character, once a device of any of these circuits has switched, it remains in that state until the applied pulsed or a.c. power returns to zero. Thus, devices C,D latch in their voltage state and devices U,B are disabled. Devices W,Z of flip-flop 21, however, can be switched at any time an input appears on control line portions 33,34. To the extent that device U of AND gate 24 is already disabled by the lack of current in current path 29, and control portion 40, an input K in control line 31 has no effect and flip-flop 21 remains with current in device Z and control line portion 23, and not in device W and control line 22, so that the same output will be provided when the pulsed or a.c. power goes on in a subsequent cycle. Note however, that neither of devices R,S of AND gate 25 is switched to its voltage state because no input has been applied to control line 32 of device R.

If, however, a signal should appear on control line 32 at any time during the same portion of the applied a.c. or pulsed power, device R will switch. After devices C,D have latched and current flows in control line portion 41, device S will switch and current Ig5 can be delivered to control line portion 34 via interconnection 27, switching device Z and changing the state of flip-flop 21. At this point, it should be recalled that SGA 1 is locked in its already assumed condition until the applied power goes to zero. Thus, even though device Z of flip-flop 21 switches causing current Idc to flow in control line portion 22 and switching device A of SGA 1, device B remains in its zero voltage state preventing any change in the output of SGA 1 at M,N. B remains in its zero voltage state even though current Ig2 flows therein because device B has no control magnetic field as a result of current Ig3 being diverted from current path 36 when device C switched and latched in its voltage state. Current Ig2 is therefore diverted to ground via device B and no output N appears. When the pulsed or a.c. power returns to the zero voltage state, all devices in SGA 1 and in AND gates 24,25 reset to their zero voltage state in readiness for the next cycle. When the pulsed or a.c. power rises on the next cycle, flip-flop 21 has already been changed and an output representative of that change will be delivered to load RL2 in the form of output N and SGA 1 will lock in that state and AND gate 24 is enabled to accept an input during the same pulsed or a.c. powered cycle.

The Josephson devices of SGA 1, flip-flop 21 and AND gates 24, 25 mentioned herein above in connection with FIGS. 1,3 may be any well known type of Josephson junction or may be a multiple junction device known as an interferometer. In addition, all the interconnection circuitry like interconnection lines 4,7,22,23,26,27,29, and 30 and control line portions 37,39,40 and 41 and loop 35 are made from materials which are superconductive at the temperature of liquid helium (approximately 4.2° K). Typical Josephson junctions and interconnection circuitry which may be utilized in the practice of the present invention are shown in U.S. Pat. No. 3,758,795, Ser. No. 267,841, filed June 30, 1972 and assigned to the same assignee as the present invention. A typical fabrication technique for forming Josephson junction devices is shown in U.S. Pat. No. 3,849,276, Ser. No. 125,993, filed Mar. 19, 1971 which is also assigned to the same assignee as the present invention. Resistances such as RL2,RR, RX,R3, which must not be superconductive at the circuit operating temperature, may be fabricated with compatible materials which display resistance at the desired operating temperature. U.S. Pat. No. 3,913,120, Ser. No. 429,461, filed Dec. 28, 1973 and assigned to the same assignee as the present invention show a material and a method of fabrication for circuitry and a resistor which may be utilized in the practice of the present invention.

While the invention has been particularly shown and described with reference to preferred embodiments thereof, it will be understood by those skilled in the art that the foregoing and other changes in form and details may be made therein without departing from the spirit and the scope of the invention.

What is claimed is:

1. A self gating circuit comprising:
    a latching circuit which includes at least a pair of devices capable of carrying Josephson current which provide via output interconnection lines connected to said pair of devices true and complement outputs in response to true and complement inputs,
    a source of pulsed power of given pulse duration connected to said latching circuit, and,
    means for maintaining the outputs obtained in response to said true and complement inputs for said given pulse duration despite a change in said inputs within said given pulse duration.

2. A self gating circuit according to claim 1 wherein said latching circuit includes a pair of circuits each including at least a pair of actuable devices capable of carrying Josephson current connected in parallel, and,
    a terminating load connected in parallel with each of said a pair of actuable devices via said an output interconnection line said load having a value of impedance sufficient to cause said pair of circuits to operate in a latching mode.

3. A self gating circuit according to claim 1 wherein said means for maintaining includes means for preventing said latching circuit from providing outputs different from those initially provided during said given pulse duration.

4. A self gating circuit according to claim 2 wherein said means for maintaining the outputs for said given pulse duration includes a current path disposed in series with a first one of said pair of actuable devices of one and the other of said pair of circuits, said current path of said one of said pair of circuits having a portion thereof disposed in electromagnetically coupled relationship with a second one of said pair of actuable devices of said other of said pair of circuits, said current path of said other of said pair of circuits having a portion thereof disposed in electromagnetically coupled relationship with a second one of said pair of actuable devices of said one of said pair of circuits.

5. A self gating circuit according to claim 2 wherein said means for maintaining the outputs for said given pulse duration includes a current path one portion of which is disposed in electromagnetically coupled relationship with one of said pair of actuable devices of one of said pair of circuits and another portion of which is disposed in electromagnetically coupled relationship with one of said pair of actuable devices of the other of said pair of circuits, at least one switchable device capable of carrying Josephson current disposed in said current path and in electromagnetically coupled relationship with each of said output interconnection lines, a terminating impedance disposed in parallel with said at least one switchable device and a source of pulsed power of pulse duration equal to said given pulse duration connected to said current path.

6. A self gating circuit according to claim 2 further including a flip-flop having input and output terminals the outputs of which are electrically coupled to said latching circuit.

7. A self gating circuit according to claim 2 wherein said source of pulsed power is connected to each of said pair of circuits.

8. A self gating circuit according to claim 6 further including means connected to said input terminals of said flip-flop for applying true and complement signals thereto and means electrically coupled to said means for applying for gating to said flip-flop during said given pulse duration newly applied true and complement signals which are different from those initially applied to said flip-flop during said given pulse duration.

9. A self gating circuit according to claim 7 wherein said source of pulsed power is a current source of unipolar current pulses.

10. A self gating circuit according to claim 7 wherein said source of pulsed power is a current source of alternating current.

11. A self gating circuit according to claim 7 wherein said source of pulsed power is a current source of alternating bipolar pulses.

12. A self gating circuit according to claim 8 wherein said means for applying includes a pair of AND gates each of which comprises an input terminal, first and second devices capable of carrying Josephson current connected in parallel, an output load, and, an interconnection line a portion of which is disposed in electromagnetically coupled relationship with said an input terminal of said flip-flop.

13. A self gating circuit according to claim 12 wherein said means for gating to said flip-flop includes a portion of said output interconnection lines disposed in electromagnetically coupled relationship with said second devices of said pair of AND gates to enable at least that one of said pair of AND gates to which a signal in the form of zero current was initially applied during said given pulse duration.

14. A self gating circuit comprising
a pair of circuits each including at least a single actuable device capable of carrying Josephson current,
a source of pulsed power of given pulse duration connected to each of said circuits,
means connected to said circuits for applying true and complement inputs to one and the other, respectively, of said pair of circuits,
a terminating load connected to each of said pair of circuits via an output interconnection line for providing true and complement outputs in response to said true and complement inputs within said given pulse duration said load having a value of impedance sufficient to cause said pair of circuits to operate in a latching mode, and,
means interconnecting said pair of circuits for maintaining the outputs obtained in response to said true and complement inputs during said given pulse duration despite a change in said inputs within said given pulse duration.

15. A self gating circuit according to claim 14 wherein said means for maintaining includes means for disabling one of said pair of curcuit when the other of said pair of circuit provides an output so that a change in said inputs within said given pulse duration is ineffective to change said outputs.

16. A self gating circuit according to claim 14 wherein said means connected to said circuits for applying true and complement inputs to one and the other of said pair of circuits includes a flip-flop having input and output terminals the outputs of which are electrically coupled to one and the other of said pair of circuits.

17. A self gating circuit according to claim 16 further including means connected to said input terminals of said flip-flop for applying true and complement signals thereto and means electrically coupled to said means for applying for gating to said flip-flop during said given pulse duration newly applied true and complement signals which are different from those initially applied to said flip-flop during said given pulse duration.

18. A self gating circuit according to claim 17 wherein said pair of circuits each includes at least a pair of actuable devices capable of carrying Josephson current connected in parallel, said terminating load being connected in parallel with said at least a pair of actuable devices.

19. A self gating circuit according to claim 18 wherein said means for maintaining one of said pair of circuits includes a current path disposed in series with a first one of said pair of actuable devices of one and the other of said pair of circuits, said current path of said one of said pair of circuits having a portion thereof disposed in electromagnetically coupled relationship with a second one of said pair of actuable devices of said other of said pair of circuits, said current path of said other of said pair of circuits having a portion thereof disposed in electromagnetically coupled relationship with a second one of said pair of actuable devices of said one of said pair of circuits.

20. A self gating circuit according to claim 18 wherein said means for maintaining one of said pair of circuits includes a current path one portion of which is disposed in electromagnetically coupled relationship with one of said pair of actuable devices of one of said pair of circuits and another portion of which is disposed in electromagnetically coupled relationship with one of said pair of actuable devices of the other of said pair of circuits, at least one switchable device capable of carrying Josephson current disposed in said current path and in electromagnetically coupled relationship with each of said an output interconnection lines, a terminating impedance disposed in parallel with said at least one switchable device and a source of pulsed power of pulse duration equal to said given pulse duration connected to said current path.

21. A self gating circuit according to claim 19 wherein said means for applying includes a pair of AND gates each of which comprises an input terminal, first and second Josephson devices connected in parallel, an output load, and, an interconnection line a portion of which is disposed in electromagnetically coupled relationship with said an input terminal of said flip-flop.

22. A self gating circuit according to claim 20 wherein said means for applying includes a pair of AND gates each of which comprises an input terminal, first and second Josephson devices connected in parallel, an output load, and, an interconnection line a portion of which is disposed in electromagnetically coupled relationship with said an input terminal of said flip-flop.

23. A self gating circuit according to claim 21 wherein said means for gating to said flip-flop includes a portion of said output interconnection lines disposed in electromagnetically coupled relationship with said second devices of said pair of AND gates to enable at least that one of said pair of AND gates to which a signal in the form of zero current was initially applied during said given pulse duration.

24. A self gating circuit according to claim 22 wherein said means for gating to said flip-flop includes a portion of said output interconnection lines disposed in electromagnetically coupled relationship with said second devices of said pair of AND gates to enable at least that one of said pair of AND gates to which a signal in the form of zero current was initially applied during said given pulse duration.

25. A latch circuit comprising:
a latching circuit which includes at least a pair of devices capable of carrying Josephson current which provides via output interconnection lines connected to said pair of devices true and complement outputs in response to true and complement inputs which are applied to said circuit during a given interval,
a flip-flop having input and output terminals the outputs of which are electrically coupled to said latching circuit,
means connected to said input terminals of said flip-flop for applying true and complement signals thereto,
means for maintaining the outputs obtained in response to said true and complement inputs for said given interval despite a change in said inputs within said given interval,
means electrically coupled to said means for applying for gating to said flip-flop during said given interval newly applied true and complement signals which are different from those initially applied to said flip-flop during said given interval, and,
a source of pulsed power of pulse duration equal to said given interval connected to said latching circuit and said means for applying and a source of d.c. power connected to said flip-flop.

26. A latch circuit according to claim 25 wherein said latching circuit includes a pair of circuits each including at least a pair of actuable devices capable of carrying Josephson current connected in parallel, and,
a terminating load connected in parallel with each of said a pair of actuable devices via said an output interconnection line said load having a value of impedance sufficient to cause said pair of circuits to operate in a latching mode.

27. A latch circuit according to claim 25 wherein said means for applying includes a pair of AND gates each of which comprises an input terminal, first and second devices capable of carrying Josephson current connected in parallel, an output load, and, an interconnection line a portion of which is disposed in electromagnetically coupled relationship with said an input terminal of said flip-flop.

28. A self gating circuit according to claim 25 wherein said means for gating includes a portion of said output interconnection lines disposed in electromagnetically coupled relationship with said second device of said pair of AND gates to enable at least that one of said pair of AND gates to which a signal in the form of zero current was initially applied during said given pulse duration.

29. A latch circuit according to claim 25 wherein said source of pulsed power is a source of clipped alternating current.

30. A latch circuit according to claim 25 wherein said source of pulsed power is a current source of unipolar current pulses.

31. A latch circuit according to claim 26 wherein said means for maintaining the outputs for said given pulse duration includes a current path one portion of which is disposed in electromagnetically coupled relationship with one of said pair of actuable devices of one of said pair of circuits and another portion of which is disposed in electromagnetically coupled relationship with one of said pair of actuable devices of the other of said pair of circuits, at least one switchable device capable of carrying Josephson current disposed in said current path and in electromagnetically coupled relationship with each of said output interconnection lines, a terminating impedance disposed in parallel with said at least one switchable device and a source of pulsed power of pulse duration equal to said given pulse duration connected to said current path.

32. A latch circuit according to claim 26 wherein said means for maintaining the outputs for said given pulse duration includes a current path disposed in series with a first one of said pair of actuable devices of one and the other of said pair of circuits, said current path of said one of said pair of circuits having a portion thereof disposed in electromagnetically coupled relationship with a second one of said pair of actuable devices of said other of said pair of circuits, said current path of said other of said pair of circuits having a portion thereof disposed in electromagnetically coupled relationship with a second one of said pair of actuable devices of said one of said pair of circuits.

* * * * *